FREQUENCY-SELECTIVE ELECTRICAL NETWORK

Filed March 18, 1952 3 Sheets-Sheet 1

INVENTORS:
JOHN F. BELL
LLOYD E. MATTHEWS

BY Francis W. Crotty

THEIR ATTORNEY.

July 3, 1956 J. F. BELL ET AL 2,753,457

FREQUENCY-SELECTIVE ELECTRICAL NETWORK

Filed March 18, 1952 3 Sheets-Sheet 2

*INVENTORS:*
JOHN F. BELL
LLOYD E. MATTHEWS

*BY* Francis W. Crotty

THEIR ATTORNEY.

FREQUENCY-SELECTIVE ELECTRICAL NETWORK

Filed March 18, 1952 3 Sheets-Sheet 3

INVENTORS:
JOHN F. BELL
LLOYD E. MATTHEWS
BY Francis W. Crotty
THEIR ATTORNEY.

United States Patent Office 2,753,457
Patented July 3, 1956

2,753,457

FREQUENCY-SELECTIVE ELECTRICAL NETWORK

John F. Bell, Glenview, and Lloyd E. Matthews, Chicago, Ill., assignors to Zenith Radio Corporation, a corporation of Illinois Application March 18, 1952, Serial No. 277,194
7 Claims. (Cl. 250—40)

This invention relates to a frequency-selective electrical network tunable over a wide range of frequencies and exhibiting a substantially constant frequency response throughout that range. The invention is useful in a variety of applications, but is especially suited for application to the tunable stages of a television receiver of the superheterodyne type and will be described in that connection.

It is anticipated that frequency allocations for television broadcasting will be established in the range of frequencies from approximately 500 mcs. to 1,000 mcs.; in all probability 60 channels will occupy a range of 420 mcs. The large number of channels and the extreme frequency range impose many problems pertaining to accurate tuning and proper tracking of selector circuits to insure effective operation of the receiver on each signal channel. They also present problems relating to oscillator radiation from the receiver and difficulties in securing adequate heat dissipation to prevent overheating and localized distortion of the circuit components with attendant impairment in performance.

In constructing a superheterodyne receiver for the new television band, it has been found desirable to omit radio-frequency amplification and to utilize a crystal diode mixer in place of the usual electron tube converter. This results primarily from the relatively high manufacturing costs of electron tubes which operate efficiently within the contemplated range of television frequencies. In order to provide a sufficient degree of selectivity and image rejection, the input circuit of the receiver comprises two tunable, resonant selector circuits connected in cascade. These circuits include inductance and capacitance and are electrically coupled together by a common inductive coupling impedance. A third tunable circuit, generally similar to the first two, is employed to determine the operating frequency of the local oscillator of the superheterodyne receiver. This third resonant circuit is inductively coupled to one of the tunable selector circuits, whereas the other selector is coupled to an antenna for receiving an incoming signal.

It has been discovered that in linking any two circuits of the network it is highly desirable to maintain the coupling purely inductive or purely capacitive, since any combination of these two types of linkage may introduce an additional undesirable resonant effect at some frequency within the operating range. Moreover, cost and operational factors make it preferable that single-tuned resonant circuits be employed, and use of a single type of coupling between such circuits permits achievement of a constant percent band-width with respect to frequency throughout the operating range. Adequate dissipation of heat generated in structural parts through which the current of these frequencies flows is also important, since it is anticipated that the circuits must be positioned within a confined space. Accordingly, in view of the range of frequencies involved, it is desirable to introduce means for compensating variations in frequency response exhibited by certain of the circuit elements and also to minimize influences which may be introduced through alterations in the operating temperature.

It is an object of this invention, therefore, to provide a novel frequency-selective electrical network, tunable over a wide range of frequencies and exhibiting a substantially constant frequency response throughout the range.

It is a further object of the invention to provide an improved frequency-selective electrical network in which the effects of changes in thermal operating conditions are adequately compensated and in which the coupling elements employed are substantially purely inductive or capacitive in nature.

An additional object of the invention is to furnish a novel frequency-selective electrical network, operable over a range of frequencies from approximately 500 mcs. to 1,000 mcs., which is small in size, inexpensive to construct, and efficient in operation.

It is a corollary object of the invention to provide an improved tunable frequency-selective electrical network in which the amount of radiation at signal frequencies may be adequately controlled.

The frequency-selective electrical network, in accordance with the invention, is tunable over a wide range of frequencies and has a substantially constant frequency response throughout that range. It comprises a conductive shield structure with partitions defining a plurality of segregated chambers. A plurality of primary inductance coils are each individually mounted within an assigned one of the chambers, and a plurality of conductive tuning elements are individually movably supported in paraxial alignment with the coils, each of the tuning elements forming a variable condenser with the individual coil with which it is aligned. A plurality of elongated guide members are disposed along the paths of movement of the tuning elements; these guide members individually have projecting portions spaced a distance less than the length of their associated tuning element for engaging the element and guiding its movement. A center-tapped coupling loop is supported in coupling relation to one of the coils for applying a received signal to that coil, and another coupling loop is supported within a portion of the shield structure and extends into coupling relation to a pair of the coils for supplying a heterodyning signal to be modulated with the received signal. A uni-control mechanism is employed to effect concurrent movement of the tuning elements; this mechanism is affixed to the shield structure at a plurality of points substantially coplanar with the mounting point of each of the coils.

The features of the present invention which are believed to be novel are set forth with particularity in the appended claims. The present invention itself, both as to its organization and manner of operation, together with further objects and advantages thereof, may best be understood by reference to the following description taken in connection with the accompanying drawing, in the several figures of which like reference numerals indicate like elements, and in which:

Figures 1, 1A, 2:
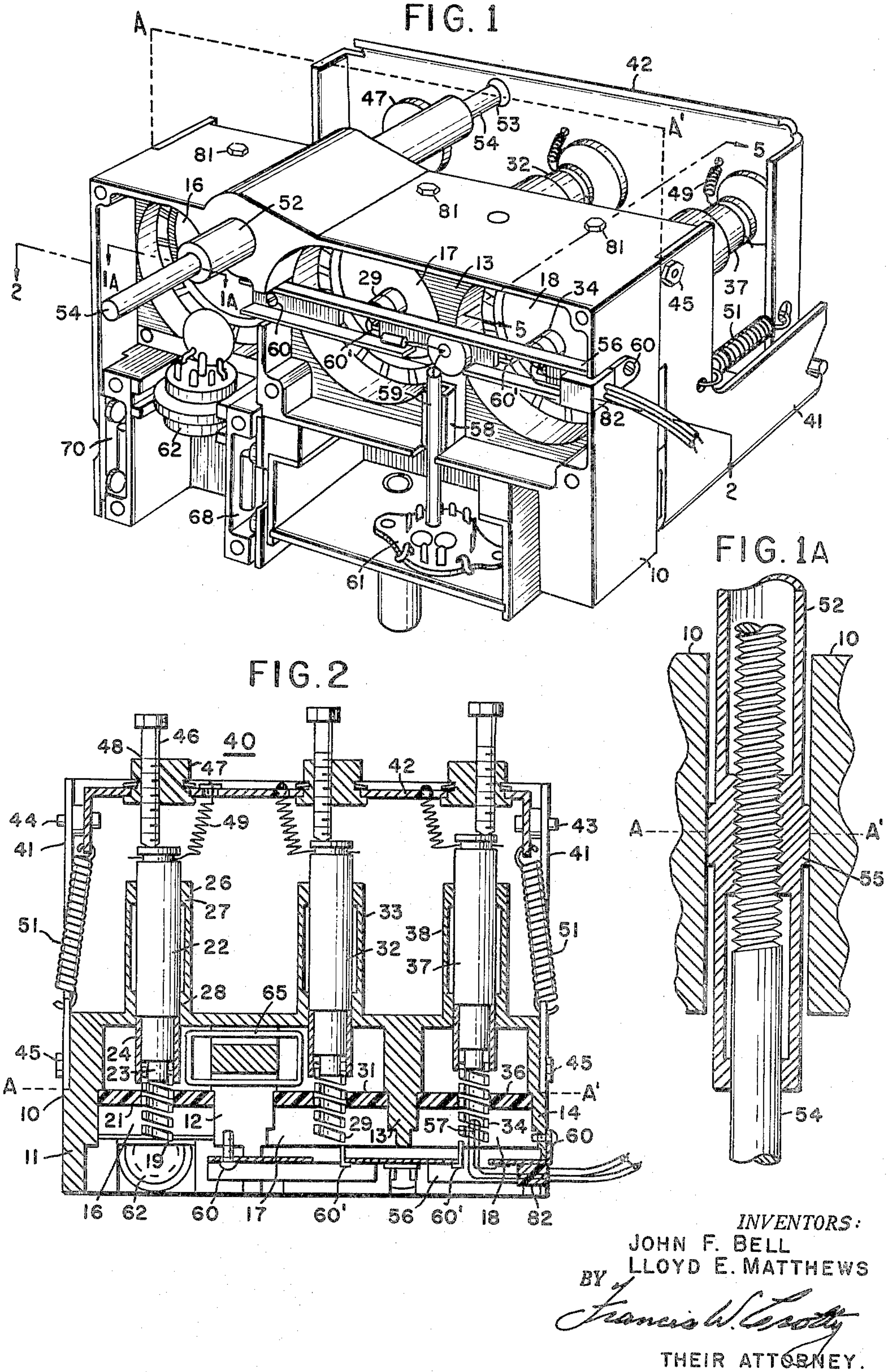
Figure 1 is a perspective view of a composite structure embodying the invention.
Figure 1A is a sectional view of a portion of the structure taken along line 1A—1A of Figure 1.
Figure 2 is a sectional view taken along line 2—2 of Figure 1.

The frequency-selective electrical network illustrated in Figure 1 comprises a shield structure 10 which is also a main supporting member for the balance of the component parts. As more clearly shown in the sectional view of Figure 2, shield structure 10 includes a plurality of partitions 11, 12, 13, and 14 which define a series of segregated chambers 16, 17 and 18; the chambers as portrayed are cylindrical in form, but may be of any desired configuration. A primary inductance coil 19 is centrally mounted within chamber 16 and is supported and insulated from the shield structure by a disc-shaped bushing 21 of electrical insulating material such as "Rexolite" #1422. A conductive tuning element 22 is supported in parallel axial alignment with coil 19, in this instance being coaxial with the coil. The portion of element 22 adjacent to coil 19 has an inner section 23 of smaller diameter than the internal diameter of the coil and an external section 24 of larger internal diameter than the external diameter of the coil. This configuration provides an annular recess in tuning element 22 into which the terminating convolutions of coil 19 are received when the tuning element is moved toward the coil.

Tuning element 22, which is movably supported relative to coil 19 by a structure to be more completely described hereinafter, constitutes a tuning capacitance for inductive coil 19; in operation, movement of the tuning element with respect to the coil is limited to substantially 30% of the axial length of the coil so that the reactance variation in the circuit caused by movement of element 22 is essentially purely capacitive. A similar resonant circuit is disclosed and claimed in the co-pending application of Arvid E. Chelgren, Serial No. 146,845, filed February 28, 1950, now Patent No. 2,595,764, issued April 6, 1952, and assigned to the same assignee as the present application.

Tuning element 22 is mounted within an elongated guide member 26 which is electrically and mechanically connected to shield structure 10; in the present instance guide 26 and shield 10 are integrally cast as a single piece and are composed of a material exhibiting the properties of high thermal and electrical conductivity. A preferred form of construction comprises manufacture of this composite shield-and-guide structure as an aluminum die-casting. Guide member 26 defines a cylindrical hollow shaft of an internal diameter sufficiently greater than the external diameter of tuning element 22 to permit movement of the tuning element without contact with the major portions of the guide member. The guide member further includes a pair of internally projecting portions 27 and 28, spaced a distance less than the axial length of tuning element 22, which are of a diameter substantially equal to that of element 22 and which engage the tuning element and guide the movement thereof.

Chamber 17 encloses a primary inductance coil 29 supported by a bushing 31; a tuning element 32 is maintained in paraxial alignment with coil 29 by a guide member 33 to complete a structure basically similar to that described in connection with chamber 16. A similar structure is defined by chamber 18, a coil 34, a bushing 36, a tuning element 37 and a guide member 38. The complete network assembly, therefore, presents a plurality of tunable resonant circuits each including a primary inductance coil, a variable condenser formed by the capacitive linkage between that coil and its associated tuning element, and adequate means for guiding movement of the tuning element.

A uni-control mechanism 40 is provided to effect concurrent movement of the three tuning elements 22, 32 and 37. Mechanism 40 includes a bracket 41, which may be formed from sheet steel or similar material, affixed to shield structure 10 at a plurality of points 45, only one of which appears in Figure 1. All of the mounting points 45 lie substantially within the plane A indicated in dotted outline in Figure 1. Plane A appears as a dotted line A—A′ in Figure 2 and, as indicated, corresponds closely to the mounting points between coils 19, 29 and 34 and bushings 21, 31 and 36 respectively. A lever supporting member 42 is pivotally mounted to bracket 41 by a pair of pivot pins 43, 44. A lever extension 46 is eccentrically mounted in a lug member 47 rotatably fixed to support member 42. The mounting connection between lever extension 46 and lug 47 comprises a threaded joint 48 which permits adjustment of the length of extension 46 projecting from member 42. Tuning element 22 is linked to support member 42 by a connecting spring 49 which biases element 22 into contact with the portion of extension 46 projecting internally of support 42. The biasing action of spring 49, which is not paraxial with the tuning element, also urges element 22 into positive contact with projection 27 of guide member 26. Similar mounting structures connect tuning elements 32 and 37 to the lever support member. A pair of biasing springs 51 continuously urge member 42 toward the tuning elements and therefore tend to move the tuning elements into closer relationship with coils 19, 29 and 34 respectively. The position of uni-control mechanism 40 is regulated by an adjustable stop 53, shown in Figure 1, which engages lever support 42 in opposition to the biasing force exerted thereupon by springs 51. As more clearly indicated in the sectional view of Figure 1A, adjustable stop 53 comprises the end of a shaft 54 which is threaded into a bushing 52. Bushing 52 is mounted in shield structure 10, preferably being pressed into a suitable recess in the shield structure; the contact between shield 10 and bushing 52 is restricted to a small section 55 of the bushing and is centered generally about plane A of Figure 1 which appears in this view as the line A—A′.

Referring again to Figure 1, a conductive channel 56 is mounted on the base of shield structure 10 and is electrically and mechanically connected to shield structure 10 by a pair of mounting bolts 60 and to coils 34 and 29 by two leads 60′; channel 56 also supports a coupling loop 57 shown schematically in Figure 2 but more completely described in connection with Figures 6–8. A lateral extension 58 of channel 56 houses a crystal diode mixer 59 which is in turn connected to coil 29 and to a terminal of a tube socket 61; the position of socket 61 in the structure may be more clearly seen in the bottom plan view of Figure 3, which also indicates the position of a second tube socket 62. A coupling loop 65, shown in Figure 2, is mounted within a slot formed in partition 12 of shield structure 10 and extends into coupling relation with coils 19 and 29 and their respective associated tuning elements 22 and 32. Loop 65 is electrically insulated from the partition to preserve the coupling connection.

The resonant circuit comprising coil 34 and tuning element 37 constitutes the initial stage or selector of the frequency-selective network; a received signal is applied to coil 34 through its coupled relation to loop 57. The resonant circuit of coil 29 and tuning element 32 is connected in cascade with the initial selector by channel member 56; the operation and advantages derived through use of this type coupling structure are disclosed in the co-pending application of Arvid E. Chelgren et al., Serial No. 227,834, filed May 23, 1951, and assigned to the same assignee as the present application. The signal selected by the resonant circuits including coils 34 and 29 is applied to the crystal diode 59 through the connection between the diode and coil 29.

The circuit comprising coil 19 and tuning element 22 forms a part of the frequency-determining network of a local oscillator, as will be more completely described in connection with Figure 4. It is desirable that the linkage supplied by coupling loop 65 between this circuit and the second selector including coil 29 be purely inductive in nature, in order to avoid introducing an undesirable resonance in the circuit. Furthermore, it has been discovered that the dimensions of this oscillator portion of the network should preferably be somewhat different from those of the two pre-selector circuits in order to achieve optimum correspondence between the resonance characteristics of the three circuits. However, when this expedient is resorted to, the coupling provided by loop 65 tends to vary somewhat with frequency, and consequently the amount of oscillatory excitation supplied to diode 59 through coil 29 increases with increased frequency. Compensation for this effect is achieved by positioning coupling loop 65 so that it extends into coupling relation both to coils 19 and 29 and to their associated tuning elements 22 and 32. As the network is adjusted for operation at higher frequencies, the tuning elements are withdrawn from their respective coils and present less area in close conjunction with coupling loop 65; this reduces the coupling between the two resonant circuits at the upper end of the frequency spectrum and therefore compensates for any divergence in excitation. Employment of a minimum number of turns, preferably one, in the loop 65 effects substantially purely inductive coupling between the circuits of coils 19 and 29 and minimizes possible deleterious effects which would result from a combination of capacitive and inductive elements in the coupling circuit.

The resonant frequencies of the two pre-selector circuits and the oscillator circuit are all regulated by operation of uni-control mechanism 40; movement of stop 53 with respect to shield structure 10 through rotation of shaft 54 concurrently moves each of the tuning elements 22, 32 and 37 with respect to their associated coils. The advantages of this general type of uni-control mechanism are illustrated and discussed in the co-pending application of Arvid E. Chelgren, Serial No. 202,227 filed December 22, 1950, now Patent No. 2,632,109, issued March 17, 1953, and assigned to the same assignee as the present application. The mechanism 40 provides the same desirable individual adjustments in the starting point of each of the tuning elements and in their individual rates of travel as disclosed in that application, and in addition assures a more positive contact between the guide members and the tuning elements by applying a lateral as well as an axial thrust thereto.

In addition to controlling the movements of tuning elements 22, 32 and 37, guide structures 26, 33 and 38 serve a very useful and practical electrical function. At the frequencies between 500 mcs. and 1,000 mcs. straight lengths of electrical conductors appear electrically as inductive elements; the length of the tuning element 22 may therefore be considered as an inductance connected to the shield structure by a pair of similar but small inductances, formed by the contact portions 27, 28 in a pi-type impedance network. In order to maintain uniform tracking it is desirable that the pi-type impedance network so formed be essentially uniform in each of the tunable networks, since otherwise calibration for tracking purposes presents an extremely difficult problem. For this reason, each guide member is constructed to provide contact with its associated tuning element at predetermined points and to avoid any possibility of stray contacts at intermediate points. The structure illustrated in Figure 2, in which guide member 26 contacts tuning element 22 only at projection points 27 and 28 affords an efficient and practical method of preserving uniformity in the aforementioned inductive network. A corollary advantage is obtained through a reduction in the maximum length of tuning element 22 which may extend beyond the last point of contact with guide member 26; it has been found that a reduction in this length effects a corresponding reduction in the amount of signal-frequency energy radiated from this portion of the structure, and that the provision for contact between tuning element 22 and guide member 26 at projection 27 effectively assists in reduction of this undesired radiation.

The physical dimensions of the tuner structure are intimately related to its electrical performance and any uncontrolled deformation may result in unpredictable effects on the frequency stability of the individual circuits. The electron discharge devices associated with sockets 61 and 62 generate considerable heat energy when the device is operated; it has therefore been found desirable to provide for rapid heat dissipation by forming shield structure 10 from a material of high thermal conductivity such as aluminum. For reasons of practical economy and for further assistance in heat dissipation, shield structure 10, including partitions 11, 12, 13 and 14 and guide members 26, 33 and 38, are all die-cast as a single aluminum structure. Tuning elements 22, 32 and 37, on the other hand, are most efficient in operation when formed from steel or other ferrous material and this type of material is also preferred for uni-control mechanism 40. Utilization of two such dissimilar metals in major portions of the overall structure presents a considerable problem with respect to thermal compensation, since the materials have varying expansions as well as conductivity and therefore tend to expand unequally and alter the physical relationship of the various component elements as the operating temperature of the device changes. The problem is effectively minimized by maintaining the mounting connections between uni-control mechanism 40 and shield structure 10 substantially coplanar with the mounting points of coils 19, 29 and 34 and therefore also coplanar with the extreme travel limits of their associated tuning elements. This structural arrangement, in which any inequities in thermal expansions and contraction will be centered about plane A, permits effective compensation through adjustment of the position of uni-control mechanism 40, since contact between shield 10 and mechanism 40 at the mounting point 55 of bushing 52 and at bracket mounting points 45 are all based on the same plane.

Figure 4:
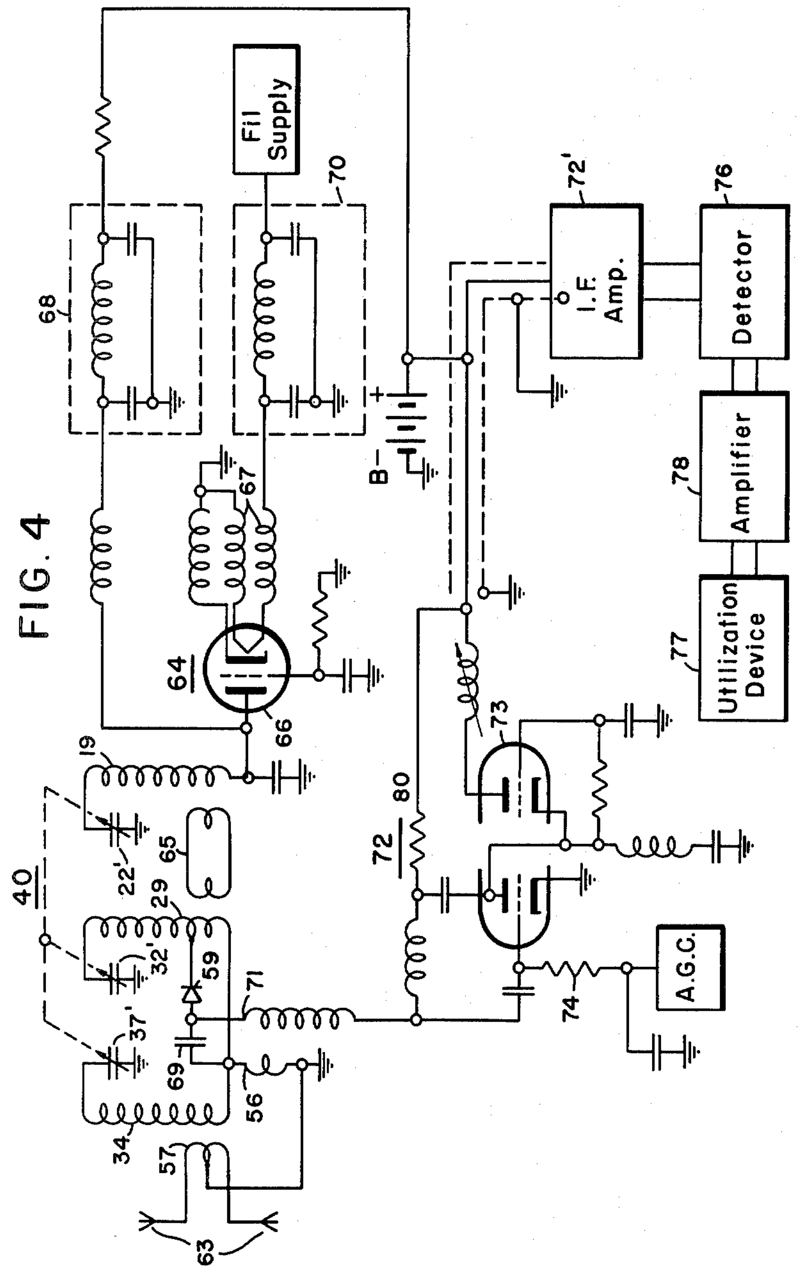
Figure 4 illustrates schematically the electrical circuit for the network structure shown in Figures 1–3 comprising a portion of a complete superheterodyne receiver; the remainder of the receiver is shown by block diagram.

In order to present a complete and understandable picture of the components of the frequency selective electrical network and their relationship to each other and to other portions of the superheterodyne circuit in which they are employed, the circuit diagram of Figure 4 has been included. A balanced antenna 63 is connected to center-tapped coupling loop 57; loop 57 is inductively coupled to primary inductance coil 34 which forms a portion of a cascaded pair of stages defined by the elements contained within chambers 17 and 18 of Figure 2. A variable condenser 37' is connected in series with coil 34; this variable capacitance is formed by the capacitive coupling between tuning element 37 and coil 34. Similar variable condensers 32' and 22' indicate the capacitive coupling relationship between tuning elements 32 and 22 and the coils with which they are associated. The uni-control mechanism 40 is indicated in dotted outline as a ganging connection for effecting concurrent variation of capacitors 22', 32' and 37'. Coupling loop 65 inductively links coil 29 and coil 19, while connections from ground and the lower extremity of coil 19 couple resonant circuit 19, 22' into an oscillator 64 which includes a triode type of electron-discharge device 66 received by socket 62. The oscillator circuit is of the type described in the co-pending application of John F. Bell, Serial No. 164,784, filed May 27, 1950, now Patent No. 2,663,799, issued December 22, 1953, and assigned to the same assignee as the present invention. The control electrode of tube 66 is grounded for radio-frequency signal voltages through a parallel connected condenser and resistor combination, whereas its cathode is maintained above ground potential by a tri-filar radio frequency choke 67. The frequency-determining circuit of the oscillator includes, in parallel with coil 19, the series combination of the control electrode-anode capacitance of tube 66 and the variable capacitance 22'. Such an oscillator is identally suited for operation over a wide range of frequencies in the ultra-high frequency portion of the spectrum, but any other known type of oscillator may be employed.

In order to reduce undesirable radiation from the oscillator circuit, a pair of pi-type filter networks are included in the cathode and anode circuits of the oscillator; each of these filters comprises an inductance connected to ground through a pair of capacitors. The filter circuits are mounted in a pair of cavities 68 and 70 indicated by dotted outline in Figure 4 and shown in Figure 1 immediately adjacent to but electrically shielded from tube socket 62.

One terminal of crystal diode 59 is connected to a tap on coil 29; the other terminal of the diode is connected to channel 56 through a capacitor 69 having a high reactance for signal voltages of intermediate frequency and a low reactance for received signal frequencies. A conductor 71 joins the conjunction of capacitor 69 and diode 59 to the first stage of an intermediate-frequency amplifier 72 which includes a grid-driven triode stage coupled in cascade with a grounded-grid, cathode-driven triode stage. These two stages employ a twin-triode electron-discharge device 73, accommodated by tube socket 61 of Figure 1. The control electrode of the first stage of intermediate-frequency amplifier 72 is connected to ground and also an automatic gain control circuit through a grid leak resistor 74. Intermediate-frequency amplifier 72 is connected in cascade to additional stages 72' of intermediate-frequency amplification, to a signal detector 76 and to a utilization device 77 through an amplifier 78 of one or more stages. A source of positive uni-directional potential B+ is connected into the anode circuit of the second stage of cascade amplifier 72 to provide a suitable operating potential therefor; the same source is connected to one terminal of crystal diode 59 through a resistor 80 and an inductive circuit including conductor 71. The resistance element 80 is selected to be very much larger than the internal resistance of the diode 59 and therefore effects constant-current biasing of the mixer diode. This type of biasing is described in detail in the co-pending application of John F. Bell, Serial No. 200,457, filed December 12, 1950, now Patent No. 2,640,919, issued June 2, 1953, and assigned to the same assignee as the present application. Bias source B+ is also utilized to provide the desired anode potential for oscillator triode 66, being connected to the anode thereof through a resistor and the anode filter circuit housed in cavity 68.

All of the components of the superheterodyne receiver preceding amplifier 72 may be of conventional construction; the general operation of such a receiver is well known in the art and a detailed description thereof is hence unnecessary. In brief, however, a signal is intercepted by antenna 63, selected by resonant circuit 34, 37', further selected by resonant circuit 29, 32', and applied to crystal diode 59, wherein it is heterodyned with the signal from local oscillator 64, the coupling of the local oscillator signal into coil 29 being provided by loop 65. Heterodyning of the local oscillator signal with the received signal produces an intermediate-frequency signal, as is well understood in the art. This intermediate-frequency signal is amplified in circuits 72 and 72' and is applied to detector 76, in which its modulation components are derived. These components are, in turn, applied to amplifier 78 and then delivered to utilization device 77.

Figures 3, 5, 6, 7, 8:
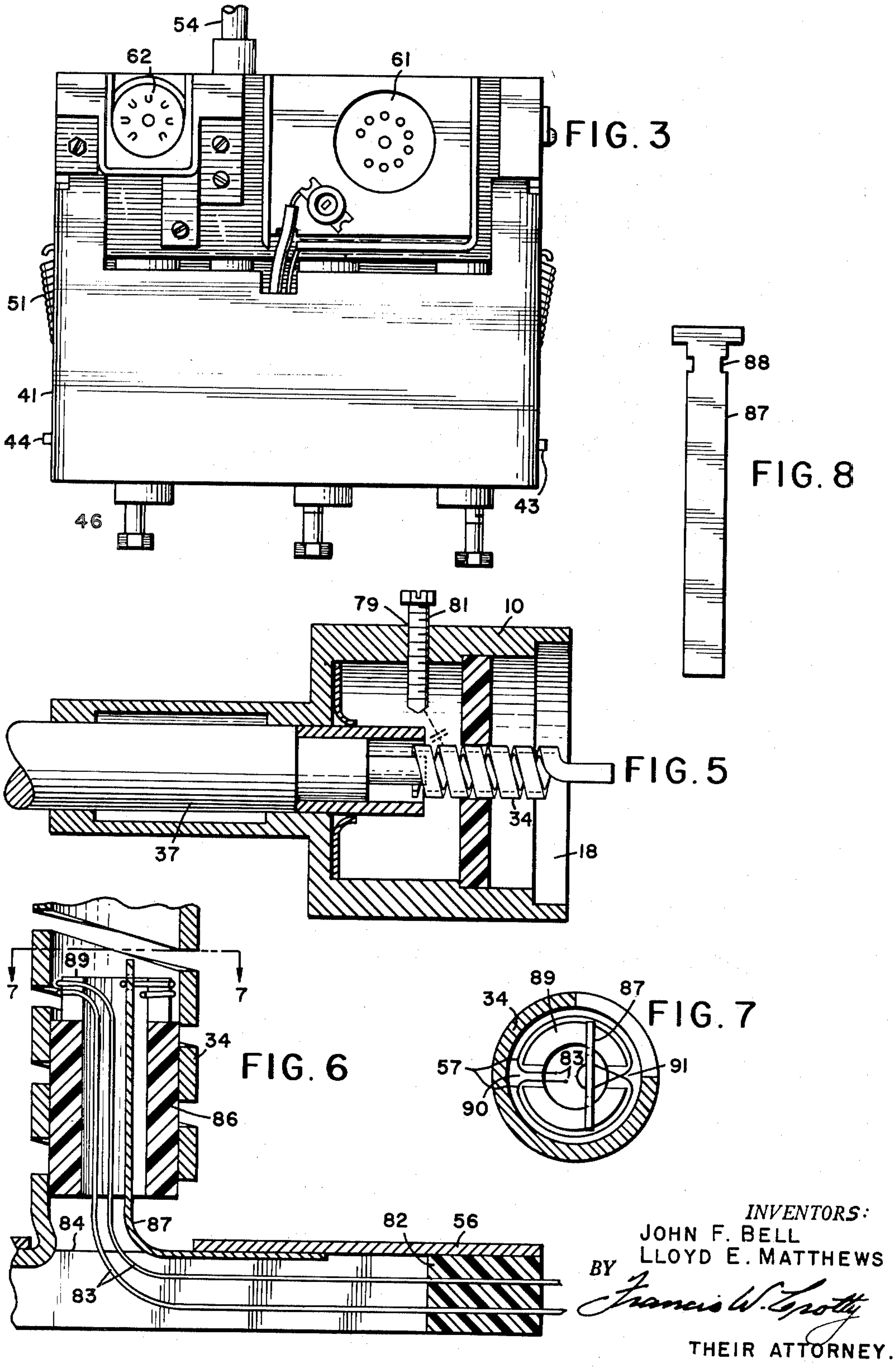
Figure 3 is a bottom plan view of the apparatus of Figure 1.
Figure 5 is an enlarged sectional view of a portion of the network structure taken along line 5—5 of Figure 1.
Figure 6 is an enlarged sectional view of the antenna coupling structure employed in the invention.
Figure 7 is an end view of that portion of the apparatus illustrated in Figure 6.
Figure 8 is a side view of one of the elements depicted in Figure 6.

The enlarged and sectionalized views of Figures 5–8 present certain of the features of the network structure of Figures 1–4 in greater detail and permit a more complete analysis of the effects of those features on the network operation. As shown in Figure 5, taken along line 5—5 of Figure 1, a threaded aperture 79 is provided in the wall of shield structure 10 at a point directly adjacent the terminal of coil 34 nearest tuning element 37. A conductive element 81 is threaded into aperture 79, and thus comprises a projection of the shield structure extending into chamber 18 in coupling relation to coil 34.

In order to effect proper tracking between the resonant circuits comprising coils 19, 29 and 34, it is desirable to provide means for adjusting the initial capacitance between each of the coils and the grounded shield structure 10; in effect, this amounts to changing the minimum capacitance of the variable condensers 37', 32' and 22' of Figure 4. This minimum capacitance is directly related to the spacing between each of the coils and the partitions of the shield structure; adjustment of element 81 thus effectively varies the capacitance between coil 34 and the shield structure and so alters the minimum capacitance of condenser 37' of Figure 4. Similar conductive shield structure extensions are utilized to vary the minimum capacitance of condensers 22' and 32'.

The structure of the center-tapped coupling loop 57 linking antenna 63 to coil 34 is illustrated in Figures 6, 7 and 8. Figure 6 shows an enlarged view of coil 34 and that portion of channel 56 immediately adjacent the coil. A block of insulating material 82 is mounted in channel 56 and has a pair of antenna leads 83 passing through it. Leads 83 continue through an aperture 84 in channel 56 and extend through the central opening in a hollow insulating bushing 86 which is mounted in the extremity of coil 34 adjacent to the channel. A conductive element 87 is affixed to bushing 86 and extends therefrom, the extension portion being electrically and mechanically connected to channel 56 by a soldered joint or other suitable means. Figure 8 shows in more detail the particular configuration employed for conductive element 87, which comprises a flat conductive strip terminating in a notched section 88. As more clearly shown in Figure 7, tubular bushing 86 has an end section 89 of reduced external diameter in which are formed two diametrically opposed slots 90 and 91. Leads 83 extend through tubular bushing 86 and branch through slot 90 to externally encircle end section 89 and form the conductive loop 57 in coupling relation to coil 34. The electrical center of loop 57 is electrically and mechanically connected to notched section 88 of conductive element 87 and through that element to channel 56 which is solidly grounded to shield structure 10.

The advantages of employing a grounded center-tapped coupling structure for the antenna feed-in will be obvious to those versed in the art; this is perhaps the most effective known method of avoiding an unbalance in voltage conditions in the primary stage of a frequency-selective network. However, circuit components of known structure and configuration are not readily applicable to apparatus of the type described in connection with Figures 1–4 due principally to size limitations and the necessity for minimizing distributed capacitance in the coupling loop. The novel structure described above and shown in Figures 6 through 8 permits utilization of a center-tapped coupling structure in conjunction with the network. Since a single loop of conductive material is employed, the possibilities for occurrence of distributed capacitances in the coupling inductance are minimized. The linkage provided is essentially inductive in nature, and closer coupling is realized than is readily obtainable by free suspension of a loop of conductive material within the coil, since it is possible to maintain precise control over the spacing between loop 57 and coil 34. A positive ground connection is provided by conductive element 87, which also serves to support bushing 86 within coil 34. The structure is easily assembled and comprises simple shapes readily manufactured from standard materials.

The frequency-selective network herein described provides a tunable circuit in which the coupling elements employed are substantially purely inductive or capacitive in nature and which therefore avoids undesirable and unpredictable resonance conditions. Adequate heat dissipation is afforded by a shield and guide structure of high thermal conductivity which eliminates local heating effects and provides for rapid dissemination of heat developed by the associated discharge devices. Effective initial calibration for tracking purposes is facilitated by the provision for adjustment of the minimum capacity of each of the three major resonant circuits. The effects of manufacturing variations in the physical dimensions of the guide members, which at these frequencies may radically affect operation of the circuit, have been minimized through provision for controlling the points of contact between the shield structure and the tuning elements; a similar provision with reference to the mounting arrangement of the uni-control mechanism compensates for variation in expansion between the uni-control mechanism and the shield structure.

While particular embodiments of the present invention have been shown and described, it will be obvious to those skilled in the art that changes and modifications may be made without departing from this invention in its broader aspects, and, therefore, the aim in the appended claims is to cover all such changes and modifications as fall within the true spirit and scope of this invention.

We claim:

1. In a tunable frequency-selective electrical network including an inductance coil, a coupling device for coupling to said coil comprising: an electrically insulating bushing mounted internally of said coil; a conductive element affixed to said bushing with an extension portion projecting therefrom for connection to a plane of reference potential; and a conductive loop mechanically supported by said bushing in coupling relation to said coil, the electrical center of said loop being connected to said conductive element.

2. In a tunable frequency-selective electrical network including a hollow inductance coil, a coupling device for coupling to said coil comprising: an electrically insulating tubular bushing mounted internally of said coil and having an end section of reduced external diameter; a conductive element extending longitudinally within said bushing, having one terminal portion disposed adjacent said reduced section of said bushing and having an opposite terminal portion projecting from said bushing for connection to a plane of reference potential; and a two-strand balanced conductive loop also extending through said tubular bushing and branching to externally encircle said reduced end section thereof in coupling relation to said coil, the electrical center of said loop being connected to said first portion of said conductive element.

3. In a tunable frequency-selective electrical network including a hollow inductance coil, a coupling device for coupling to said coil comprising: an electrically insulating tubular bushing mounted internally of said coil, and having an end section of reduced external diameter with two diametrically opposed slots; a conductive element extending longitudinally within said bushing, having one terminal portion disposed adjacent said reduced section of said bushing and having an opposite terminal portion projecting from said bushing for connection to a plane of reference potential; and a two-strand balanced conductive loop also extending through said tubular bushing and branching through one of said slots to externally encircle said reduced end section in coupling relation to said coil, the electrical center of said loop being connected to said first portion of said conductive element through the remaining one of said slots.

4. In a tunable frequency-selective electrical network including a hollow inductance coil, a coupling device for coupling to said coil comprising: an electrically insulating tubular bushing mounted internally of said coil, and having an end section of reduced external diameter with two diametrically opposed slots; a conductive element extending longitudinally through said bushing having one terminal portion overlapping and mechanically engaging said reduced section of said bushing and having an opposite terminal portion projecting from said bushing for connection to a plane of reference potential and a two-strand balanced conductive loop also extending through said tubular bushing and branching through one of said slots externally to encircle said reduced end section in coupling relation to said coil, the electrical center of said loop being connected to said first portion of said conductive element through the remaining one of said slots.

5. A frequency-selective electrical network, tunable over a wide range of frequencies and having a substantially constant frequency response throughout said range, comprising: a conductive shield structure defining a cylindrical chamber; a cylindrical primary inductance coil fixedly mounted within said chamber; a cylindrical conductive tuning element movably supported in paraxial alignment with said coil and forming a variable condenser therewith; an elongated cylindrical guide member disposed along the path of movement of said tuning element for guiding the movement thereof; and an adjustable means for varying the capacitance between said coil and said shield structure on the one hand and the capacitance between said shield structure and said tuning element on the other hand comprising a conductive projection adjustably extending from said shield structure into said chamber in coupling relation to said coil and to said tuning element.

6. A frequency selective electrical network, tunable over a wide range of frequencies and having a substantially constant frequency response throughout said range, comprising: a conductive shield structure having partitions defining a pair of segregated chambers; a pair of primary inductance coils each individually mounted within and assigned one of said chambers; a pair of conductive tuning elements individually movably supported in paraxial alignment with said coils, each of said tuning elements forming a variable condenser with the individual one of said coils with which it is aligned; a pair of elongated guide members disposed along the paths of movement of said tuning elements for guiding the movement thereof; and a coupling device mechanically supported within an internal partition of said shield structure but electrically insulated therefrom and extending into said two chambers and into coupling relation to the coils and tuning elements in said two chambers, said coupling device comprising a continuous conductor loop arranged between said capacitive tuning elements.

7. A frequency-selective electrical network, tunable over a wide range of frequencies and having a substantially constant frequency response throughout said range, comprising: a conductive shield structure having partitions defining a pair of segregated chambers; a pair of primary inductance coils each individually mounted within an assigned one of said chambers; a pair of conductive tuning elements individually movably supported in paraxial alignment with said coils, each of said tuning elements forming a variable condenser with the individual one of said coils with which it is aligned; and a coupling device mechanically supported within an internal partition of said shield structure and extending into said two chambers and into coupling relation to said coils and to said tuning elements in said two chambers for deriving a signal from one of said coils and injecting said signal into the other of said coils, said coupling device comprising a continuous conductor loop arranged between said capacitive tuning elements.

References Cited in the file of this patent

UNITED STATES PATENTS

| | | |
|---|---|---|
| 1,676,417 | True | July 10, 1928 |
| 2,140,770 | Schofield | Dec. 20, 1938 |
| 2,199,669 | Loughlin | May 7, 1940 |
| 2,247,212 | Trevor | June 24, 1941 |
| 2,258,147 | Roberts | Oct. 7, 1941 |
| 2,259,003 | Reid | Oct. 14, 1941 |
| 2,311,520 | Clifford | Feb. 16, 1943 |
| 2,312,783 | Trevor | Mar. 2, 1943 |
| 2,323,201 | Carter | June 29, 1943 |
| 2,338,134 | Sands et al. | Jan. 4, 1944 |
| 2,340,749 | Harvey | Feb. 1, 1944 |
| 2,491,480 | Davis et al. | Dec. 20, 1949 |
| 2,496,322 | Wallin | Feb. 7, 1950 |
| 2,514,957 | Larson | July 11, 1950 |
| 2,554,107 | Kleis et al. | May 22, 1951 |

FOREIGN PATENTS

| | | |
|---|---|---|
| 292,955 | Great Britain | Feb. 2, 1930 |
| 122,991 | Australia | Dec. 19, 1946 |